(12) United States Patent
Wu

(10) Patent No.: US 12,055,814 B2
(45) Date of Patent: Aug. 6, 2024

(54) DISPLAY PANEL AND DISPLAY APPARATUS

(71) Applicant: Xiamen Tianma Micro-Electronics Co., Ltd., Xiamen (CN)

(72) Inventor: Ling Wu, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 18/463,447

(22) Filed: Sep. 8, 2023

(65) Prior Publication Data

US 2023/0418104 A1  Dec. 28, 2023

(30) Foreign Application Priority Data

Jun. 29, 2023  (CN) .......................... 202310784683.3

(51) Int. Cl.
| | | |
|---|---|---|
| G02F 1/13357 | (2006.01) | |
| G02F 1/1368 | (2006.01) | |
| G02F 1/157 | (2006.01) | |
| G02F 1/163 | (2006.01) | |
| H01L 25/16 | (2023.01) | |

(52) U.S. Cl.
CPC .. *G02F 1/133603* (2013.01); *G02F 1/133617* (2013.01); *G02F 1/13685* (2021.01); *G02F 1/157* (2013.01); *G02F 1/163* (2013.01); *H01L 25/167* (2013.01); *G02F 2001/1635* (2013.01)

(58) Field of Classification Search
CPC ......... G02F 1/133603; G02F 1/133617; G02F 1/13685; G02F 1/157; G02F 1/163; G02F 2001/1635; G02F 1/133601; H01L 25/167; H01L 27/156; H01L 33/505; H01L 33/54; H01L 33/62
See application file for complete search history.

(56) References Cited

U.S. PATENT DOCUMENTS

| | | | |
|---|---|---|---|
| 2016/0042703 A1* | 2/2016 | Fan ................... | G02F 1/133621 345/88 |
| 2017/0236866 A1* | 8/2017 | Lee ....................... | H05B 47/19 257/89 |
| 2021/0013370 A1* | 1/2021 | Yan ....................... | H01L 33/501 |
| 2022/0415964 A1* | 12/2022 | Li ............................. | G09G 3/32 |

FOREIGN PATENT DOCUMENTS

| | | |
|---|---|---|
| CN | 113725248 A | 11/2021 |
| CN | 114299822 A | 4/2022 |

* cited by examiner

*Primary Examiner* — Kevin Quarterman
(74) *Attorney, Agent, or Firm* — CHRISTENSEN O'CONNOR JOHNSON KINDNESS PLLC

(57) ABSTRACT

A display panel and a display apparatus are described. In an embodiment, the display panel includes a substrate and a sub-pixel group located at a side of the substrate. In an embodiment, the sub-pixel group includes sub-pixels of at least two different colors and a light-limiting structure. In an embodiment, the sub-pixels share one light-emitting element. In an embodiment, along a direction perpendicular to the substrate, the light-limiting structure overlaps with the light-emitting element and is located at a light exit side of the light-emitting element. In an embodiment, when the display panel displays an image, the sub-pixels in the sub-pixel group are enabled in sequence. In an embodiment, the when one of the sub-pixels is enabled, the light-limiting structure causes light emitted by the light-emitting element to exit only from the enabled sub-pixel.

20 Claims, 11 Drawing Sheets

DISPLAY PANEL AND DISPLAY APPARATUS

CROSS-REFERENCE TO RELATED APPLICATION

The present application claims priority to Chinese Patent Application No. 202310784683.3, filed on Jun. 29, 2023, the content of which is incorporated herein by reference in its entirety.

TECHNICAL FIELD

The present disclosure relates to the field of display technologies, and in particular, to a display panel and a display apparatus.

BACKGROUND

With the advancement of display technologies, new technologies, such as the micro light-emitting diode (Micro LED) and sub-millimeter light-emitting diode (Mini LED) have become popular. Both Micro LED and Mini LED use the LED miniaturization and matrixing technology, which refers to integrating a high-density and small LED array on a chip. For example, in the current Micro LED technology, the Micro LEDs and driver backplane are manufactured separately, and then the Micro LEDs are transferred to the driver backplane using a mass transfer process. During the mass transfer process, the LEDs are picked up from a wafer through precise alignment, and then bonded to the driver backplane through alignment. However, an improvement of the yield of the mass transfer process is desired.

SUMMARY

In various aspects, the present disclosure provides a display panel and a display apparatus having an improved transfer yield.

One aspect of the present disclosure provides a display panel. In an embodiment, the display panel includes a substrate and a sub-pixel group located at a side of the substrate. In an embodiment, the sub-pixel group includes sub-pixels of at least two different colors, and the sub-pixels in the sub-pixel group share one light-emitting element.

In an embodiment, the sub-pixel group further includes a light-limiting structure. In an embodiment, along a direction perpendicular to a plane of the substrate, the light-limiting structure overlaps with the light-emitting element and is located at a light exit side of the light-emitting element. In an embodiment, the light-limiting structure is used to limit a light exit position of the light-emitting element.

In an embodiment, when the display panel displays an image, the sub-pixels in the sub-pixel group are enabled in sequence. In an embodiment, when one of the sub-pixels is enabled, the light-limiting structure causes light emitted by the light-emitting element to exit only from the enabled sub-pixel.

Another aspect the present disclosure provides a display panel. In an embodiment, the display panel includes a substrate and a sub-pixel group located at a side of the substrate. In an embodiment, the sub-pixel group includes sub-pixels of at least two different colors, and the sub-pixels in the sub-pixel group share one light-emitting element.

The sub-pixel group further includes a light-limiting structure. In an embodiment, along a direction perpendicular to a plane of the substrate, the light-limiting structure overlaps with the light-emitting element and is located at a light exit side of the light-emitting element. In an embodiment, the light-limiting structure is used to limit a light exit position of the light-emitting element.

In an embodiment, when the display panel displays an image, the sub-pixels of mutually different colors in the sub-pixel group are enabled in sequence, and the sub-pixels of a same color are enabled simultaneously. In an embodiment, when the sub-pixels of the same color are enabled, the light-limiting structure causes light emitted by the light-emitting element to exit only from the enabled sub-pixels.

According to yet another aspect, the present disclosure provides a display apparatus. In an embodiment, the display apparatus includes the display panel provided in any embodiment of the present disclosure.

BRIEF DESCRIPTION OF DRAWINGS

To describe the technical solutions in the embodiments of the present disclosure or in the prior art more clearly, the following briefly describes the accompanying drawings required for describing the embodiments or the prior art. The accompanying drawings in the following description show some embodiments of the present disclosure, and a person skilled in the art may still derive other drawings from these accompanying drawings without creative efforts.

DESCRIPTION OF EMBODIMENTS

Figure 1:
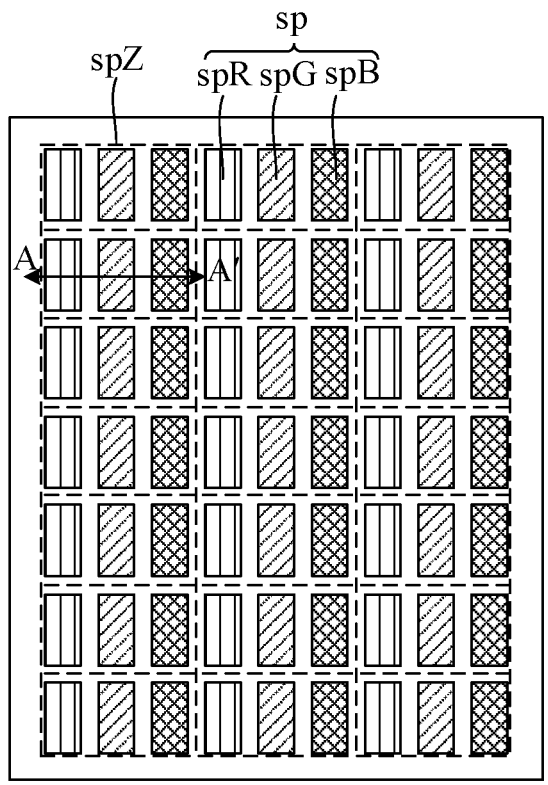
FIG. 1 is a schematic diagram of a display panel according to one or more embodiments of the present disclosure.

To make the objectives, technical solutions, and advantages of the embodiments of the present disclosure clearer, the technical solutions in the embodiments of the present disclosure will be clearly and completely described below with reference to the accompanying drawings in the embodiments of the present disclosure. The described embodiments are some rather than all of the embodiments of the present disclosure. All other embodiments obtained by those of ordinary skill in the art based on the embodiments of the present disclosure without creative efforts should fall within the protection scope of the present disclosure.

Terms used in the embodiments of the present disclosure are only for the purpose of describing specific embodiments, and are not intended to limit the present disclosure. Unless otherwise specified in the context, words, such as "a", "the", and "this", in a singular form in the embodiments of the present disclosure and the appended claims include plural forms.

Currently, as the demand for higher pixels per inch (PPI) in display products increases, the size of LEDs in LED display products is decreasing and the quantity is increasing. The smaller the size of the LEDs, the more challenging it becomes to align and pick up the LEDs in the transfer process. This requires higher machine precision, leading to lower yields in the transfer process. Conventionally, the transfer yield is generally improved by improving the transfer process and the pickup precision. However, due to the relatively mature transfer technology and transfer machine, improving the transfer yield becomes challenging, and there is limited room for further enhancement.

In order to resolve the above problems, embodiments of the present disclosure provide a display panel. One sub-pixel group includes sub-pixels of at least two different colors, and all the sub-pixels in the sub-pixel group share one light-emitting element. The light-emitting element is an LED chip, which may be, for example, a Micro LED or a Mini LED. The sub-pixel group further includes a light-limiting structure overlapping with the light-emitting element, and the light-limiting structure is used to limit a light exit position of the light-emitting element. When the sub-pixel is enabled, the light-limiting structure causes light emitted by the light-emitting element to exit from the position of the sub-pixel; when the sub-pixel is not enabled, the light-limiting structure causes the light emitted by the light-emitting element not to exit from the position of the sub-pixel. When an image is displayed, the sub-pixels in the sub-pixel group are enabled in different time. This can be done based on the colors or the quantity of sub-pixels, ensuring that each sub-pixel displays the required grayscale. Ultimately, the sub-pixels of mutually different colors in the display panel are mixed over time to display the color image. All the sub-pixels in each sub-pixel group share one light-emitting element, and this allows for an increase in the size of the light-emitting element and a reduction in the quantity of light-emitting elements required in the production of a display panel with a fixed sub-pixel size and density. As a result, it decreases the difficulty of alignment and picking up during the mass transfer process, ultimately improving the yield of the transfer process. The above is an overview of the technical solution of the present disclosure, which will be described in detail below with reference to specific embodiments.

Figure 2:
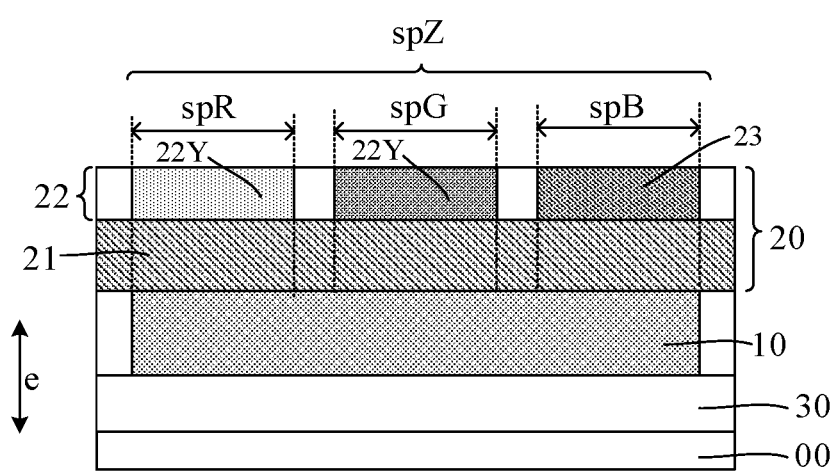
FIG. 2 is a schematic cross-sectional view taken along line A-A' in FIG. 1 according to an embodiment of the present disclosure.

FIG. 1 is a schematic diagram of a display panel according to an embodiment of the present disclosure. FIG. 2 is a schematic cross-sectional view taken along line A-A' in FIG. 1.

As shown in FIG. 1, the display panel includes a plurality of sub-pixels sp, and the plurality of sub-pixels sp include at least a red sub-pixel spR, a green sub-pixel spG, and a blue sub-pixel spB. The arrangement of the sub-pixels sp in FIG. 1 is for illustration only and is not intended to limit the present disclosure. The display panel includes a plurality of sub-pixel groups spZ, each sub-pixel group spZ includes sub-pixels sp of at least two different colors, and the sub-pixels sp in each sub-pixel group spZ share one light-emitting element. In FIG. 1, the regions of the sub-pixel groups spZ are defined by dashed lines that intersect horizontally and vertically.

FIG. 1 shows for illustration that one sub-pixel group spZ includes three sub-pixels sp: a red sub-pixel spR, a green sub-pixel spG, and a blue sub-pixel spB. In other embodiments, the sub-pixels sp in the sub-pixel group spZ include two sub-pixels sp of different colors, and the two sub-pixels sp are two of the red, green, and blue sub-pixels. In other embodiments, the sub-pixels sp in the sub-pixel group spZ include sub-pixels sp of the same color. For example, the sub-pixel group spZ includes two red sub-pixels, two green sub-pixels, and two blue sub-pixels; or the sub-pixel group spZ includes two red sub-pixels and two green sub-pixels; or the sub-pixel group spZ includes two red sub-pixels and two blue sub-pixels; or the sub-pixel group spZ includes two green sub-pixels and two blue sub-pixels. When the sub-pixel group spZ includes sub-pixels of the same color, the quantity relationship between the sub-pixels different in colors is not limited. For example, the sub-pixel group spZ may include two red sub-pixels and one green sub-pixel.

FIG. 2 shows a cross-sectional view of the sub-pixel group spZ, and regions of the sub-pixels sp in the sub-pixel group spZ are marked. As shown in FIG. 2, the display panel includes a substrate 00, and the light-emitting element 10 is located at a side of the substrate 00. The light-emitting element 10 is a simplified illustration. The light-emitting element 10 is an LED chip such as a Micro LED or a Mini LED. The sub-pixel group spZ further includes a light-limiting structure 20. Along a direction e perpendicular to a plane of the substrate 00, the light-limiting structure 20 overlaps with the light-emitting element 10 and is located at a light exit side of the light-emitting element 10. A side of the light-emitting element 10 away from the substrate 00 is the light exit side. The light-limiting structure 20 is located at the side of the light-emitting element 10 away from the substrate 00. The light-limiting structure 20 is used to limit a light exit position of the light-emitting element 10. In a conventional design, one sub-pixel includes one light-emitting element. However, in the embodiments of the present disclosure, all the sub-pixels sp in each sub-pixel group spZ share one light-emitting element 10. The light-limiting structure 20 is one of the key components that ensure the grayscale display of the sub-pixels sp of mutually different colors in the sub-pixel group spZ.

As shown in FIG. 2, the display panel further includes a driving layer 30, the driving layer 30 is provided with a plurality of pixel circuits, and the pixel circuit is used to drive the light-emitting element 10 to emit light. When the display panel provided in the embodiments of the present disclosure is fabricated, the driving layer 30 is fabricated on the substrate 00 to form a driver backplane, and then a machine is utilized to pick up a larger number of light-emitting elements 10 from a wafer in one-time alignment, and then the picked-up light-emitting elements 10 are aligned and bonded with the driver backplane.

When the display panel displays an image, the sub-pixels sp in the sub-pixel group spZ are enabled in sequence. When a sub-pixel sp is enabled, the light-limiting structure 20 causes light emitted by the light-emitting element 10 to exit only from the position of the enabled sub-pixel sp. That the sub-pixels sp in the sub-pixel group spZ are enabled in sequence means that each sub-pixel sp in the sub-pixel group spZ is enabled once, and the remaining sub-pixels sp are not enabled when one of the sub-pixels sp is enabled.

The sub-pixel group spZ including three sub-pixels: a red sub-pixel spR, a green sub-pixel spG, and a blue sub-pixel spB is used as an example for description. When the red sub-pixel spR is enabled, the light-limiting structure 20 limits the light emitted by the light-emitting element 10 to exit from the position of the red sub-pixel spR, and limits the light emitted by the light-emitting element 10 not to exit from positions of the other non-enabled sub-pixels sp in the sub-pixel group spZ. In this way, only the red sub-pixel spR in the three sub-pixels sp of the sub-pixel group spZ displays. When the red sub-pixel spR is enabled, the display grayscale of the red sub-pixel spR may be controlled by the amount of light emitted from the position of the red sub-pixel spR. Controlling the amount of light emitted from the position of the red sub-pixel spR may be realized, for example, by controlling the luminance of the light-emitting element 10, or by controlling the light transmittance of the light-limiting structure 20. The display method of the sub-pixels sp of other colors in the sub-pixel group spZ may be understood with reference to the display method of the red sub-pixel spR.

The sub-pixel group spZ includes sub-pixels sp of at least two different colors, and the sub-pixels sp in the sub-pixel group spZ are enabled in sequence (or referred to as a time-division display), such that the sub-pixels sp of different colors in the sub-pixel group spZ can be mixed over time after being enabled. When the display panel displays an image frame, the sub-pixels sp in the sub-pixel group spZ are enabled in sequence, such that all the sub-pixel groups spZ in the display panel are enabled for once, and lights from the sub-pixels sp of different colors in the display panel are mixed, over the time in which the sub-pixels sp are enabled in sequence, to display the complete color image.

The embodiments of the present disclosure provide a display panel including a plurality of sub-pixel groups spZ, each sub-pixel group spZ includes sub-pixels sp of at least two different colors, and all the sub-pixels sp in each sub-pixel group spZ share one light-emitting element 10. The sub-pixel group spZ further includes a light-limiting structure 20 overlapping with the light-emitting element 10 and located at a light exit side of the light-emitting element 10, and the light-limiting structure 20 is capable of limiting a light exit position of the light-emitting element 10. When the sub-pixel sp is enabled, the light-limiting structure 20 limits the light emitted by the light-emitting element 10 to exit pmly from the position of the enabled sub-pixel sp, and when the sub-pixel sp is not enabled, the light-limiting structure 20 limits the light emitted by the light-emitting element 10 not to exit from the position of the sub-pixel sp. When an image is displayed, the sub-pixels sp in the sub-pixel group spZ are enabled in sequence until all the sub-pixel groups spZ have been enabled, and lights exiting from the sub-pixels sp of mutually different colors in the display panel are mixed over time to display the color image. In the embodiments of the present disclosure, all the sub-pixels sp in each sub-pixel group spZ share one light-emitting element 10. This allows for an increase in the size of the light-emitting element 10 and a reduction in the quantity of light-emitting elements 10 required in production of a display panel with a fixed sub-pixel size and a fixed sub-pixel density. Increasing the size of the light-emitting element 10 can reduce the precision requirements in the transfer process. This, in turn, helps to decrease the difficulty of alignment and picking up during the transfer process, ultimately improving the yield of the transfer process. Reducing the quantity of light-emitting elements 10 can reduce the number of transfer processes, which can also improve the transfer yield.

The display panel provided in the embodiments of the present disclosure can be used in a high PPI design. In a high PPI display panel, if all the sub-pixels sp in each sub-pixel group spZ share one light-emitting element 10, the size of the light-emitting element 10 will not be too small, and the yield of the transfer process is not affected by the small size of the light-emitting element 10.

In some implementations, as shown in FIG. 2, the light-limiting structure 20 includes a light valve layer 21, and the light valve layer 21 overlaps with the light-emitting element 10. The light valve layer 21 includes light valves (not marked in FIG. 2). In the sub-pixel group spZ, each sub-pixel sp includes one light valve. The light valve has a first state and a second state, and the light valve is light transmitting in the first state and non-light-transmitting (light blocking) in the second state. In the sub-pixel group spZ, the light valve of the sub-pixel sp is in the first state when the sub-pixel sp is enabled, and the light valve of the sub-pixel sp is in the second state when the sub-pixel sp is not enabled. For example, the sub-pixel group spZ includes three sub-pixels: a red sub-pixel spR, a green sub-pixel spG, and a blue sub-pixel spB. When the red sub-pixel spR is enabled, a light valve of the red sub-pixel spR is in the first state, while light valves of the sub-pixels sp of other colors in the sub-pixel group spZ are in the second state. The light valve can be used to limit the light exit position of the light-emitting element 10. When an image is displayed, the light valve of each sub-pixel sp controls whether the sub-pixel sp is enabled or not, such that the sub-pixels sp in the sub-pixel group spZ are enabled in sequence.

In some implementations, the first state of the light valve is substantially a transparent state and the second state is substantially a black state, and the display grayscale of the sub-pixel sp is controlled by the luminance of the light-emitting element 10. A pixel circuit is provided in the display panel, the pixel circuit is coupled to the light-emitting element 10, and the luminance of the light-emitting element 10 is controlled by the pixel circuit. When the sub-pixel sp needs to be enabled, the light valve in the sub-pixel sp is in the first state, and the light emitted by the light-emitting element 10 to the position of the sub-pixel sp is basically transmitted through the light valve, and the grayscale of the sub-pixel sp can be adjusted by the pixel circuit through controlling the luminance of the light-emitting element 10. In this embodiment, the light valve is used as a switch for controlling whether the light passes through or not, and only two states need to be set for the light valve to cooperate with the sub-pixel sp for display. This can simplify the control mode of the working state of the light valve, and simplify the control circuit for controlling operation of the light valve.

In other embodiments, the light valve is involved in adjusting the display grayscale of the sub-pixel sp. The first state of the light valve includes at least a first sub-state and a second sub-state, and the light transmittance of the light valve in the first sub-state is greater than that in the second sub-state. To be specific, the first state is the light-transmitting state of the light valve, the first state further includes a plurality of sub-states, and the light valve has different light transmittances in the plurality of sub-states. When the sub-pixel sp needs to be enabled, the light valve in the sub-pixel sp is in the first state, and the light emitted by the light-emitting element 10 to the position of the sub-pixel sp can be transmitted through the light valve. When the luminance of the light-emitting element 10 is fixed, the luminance of the sub-pixel sp is higher when the light valve is in the first sub-state compared to when it is in the second sub-state, and the sub-states of the light valve can be switched to match the sub-pixel sp for different display grayscales. In this embodiment, the light valve is involved in adjusting the display grayscale of the sub-pixel sp, and it is not necessary to set a plurality of candidate luminance for the light-emitting element 10. For example, the light-emitting element 10 may have a fixed luminance, which can simplify the circuit for driving the light-emitting element 10.

In some embodiments, as shown in FIG. 2, the light-limiting structure 20 further includes a color conversion layer 22. The light valve layer 21 and the color conversion layer 22 are stacked along the direction e perpendicular to the plane of the substrate 00. FIG. 2 shows only for illustration that the color conversion layer 22 is located at a side of the light valve layer 21 away from the substrate 00. In other embodiments, the color conversion layer 22 is located at a side of the light valve layer 21 close to the substrate 00.

The color conversion layer 22 has a function of light color conversion. The color conversion layer 22 in each sub-pixel group spZ includes M color conversion units 22Y, the light valve layer 21 in each sub-pixel group spZ includes N light valves, and the quantity of light valves in the sub-pixel group spZ is the same as the quantity of sub-pixels sp, where M and N are positive integers, N≥2, and 1≤M≤N. In other words, the quantity of color conversion units 22Y in the sub-pixel group spZ is less than or equal to the quantity of light valves. A sub-pixel sp whose color is different from the color of the light emitted by the light-emitting element 10 includes the color conversion unit 22Y. In other words, a sub-pixel sp whose color is the same as the color of the light emitted by the light-emitting element 10 does not need/is not provided with the color conversion unit 22Y.

In the embodiments of the present disclosure, all the sub-pixels sp in each sub-pixel group spZ share one light-emitting element 10, and the color of the light emitted by the light-emitting element 10 is fixed, while the sub-pixels sp of different colors in the sub-pixel group spZ need to display different colors. The light-limiting structure 20 includes the stacked light valve layer 21 and color conversion layer 22. The light valve in the light valve layer 21 can control whether the light emitted by the light-emitting element 10 exits from the position of the sub-pixel sp at which the light valve is located, and the color conversion unit 22Y in the color conversion layer 22 can convert the color of the light. The light-limiting structure 20 including the color conversion layer 22 and the light valve layer 21 can cooperate with the light-emitting element 10 to achieve independent illumination of sub-pixels sp of different colors in the sub-pixel group spZ. When an image is displayed, the sub-pixels sp in the sub-pixel group spZ are enabled in sequence, and all the sub-pixel groups spZ cooperate to display, such that lights from the sub-pixels sp of different colors in the display panel are mixed over time to display the color image.

In some embodiments, the light-emitting element 10 in the display panel is a UV LED. In this case, in each sub-pixel group spZ, the quantity of light valves in the light valve layer 21 is the same as the quantity of sub-pixels sp in the sub-pixel group spZ, and the quantity of color conversion units 22Y included in the color conversion layer 22 is the same as the quantity of sub-pixels sp in the sub-pixel group spZ. That is, each sub-pixel sp is provided with one corresponding color conversion unit 22Y and one corresponding light valve.

For example, the light-emitting element 10 in FIG. 2 is a UV LED. The red sub-pixel spR includes the color conversion unit 22Y, and the color conversion unit 22Y in the red sub-pixel spR can convert the UV light emitted by the UV LED into red light and emit the red light. In an embodiment, the color conversion unit 22Y in the red sub-pixel spR includes red quantum dots. The green sub-pixel spG includes the color conversion unit 22Y, and the color conversion unit 22Y in the green sub-pixel spG can convert the UV light emitted by the ultraviolet LED into green light and emit the green light. In an embodiment, the color conversion unit 22Y in the green sub-pixel spG includes green quantum dots. An optical component 23 in the blue sub-pixel spB is the color conversion unit 22Y, and the color conversion unit 22Y in the blue sub-pixel spB can convert the UV light emitted by the UV LED into blue light and emit the blue light. In an embodiment, the color conversion unit 22Y in the blue sub-pixel spB includes blue quantum dots.

In other embodiments, the light-emitting element 10 in the display panel is a blue LED. In this case, in each sub-pixel group spZ, the quantity of light valves in the light valve layer 21 is the same as the quantity of sub-pixels sp in the sub-pixel group spZ. When the sub-pixel group spZ includes a blue sub-pixel spB, the quantity of color conversion units 22Y included in the color conversion layer 22 of this sub-pixel group spZ is less than the quantity of sub-pixels sp in this sub-pixel group spZ. When the sub-pixel group spZ does not include a blue sub-pixel spB, the quantity of color conversion units 22Y included in the color conversion layer 22 of this sub-pixel group spZ is equal to the quantity of sub-pixels sp in this sub-pixel group spZ. To be specific, since the blue sub-pixel spB has the same light color as the light-emitting element 10, the blue sub-pixel spB is provided only with the light valve and provided with no color conversion unit 22Y.

For example, the light-emitting element 10 in FIG. 2 is a blue LED. The red sub-pixel spR includes the color conversion unit 22Y, and the color conversion unit 22Y in the red sub-pixel spR can convert the blue light emitted by the blue LED into red light and emit it. The green sub-pixel spG includes the color conversion unit 22Y, and the color conversion unit 22Y in the green sub-pixel spG can convert the blue light emitted by the blue LED into green light and emit it. An optical component 23 in the blue sub-pixel spB is a scattering unit, and the scattering unit is provided in the same layer as the color conversion units 22Y in the other sub-pixels.

In some embodiments, the sub-pixels sp in the sub-pixel group spZ include a first sub-pixel, and the first sub-pixel has a color that is the same as the color of the light emitted by the light-emitting element 10. For example, the sub-pixel group spZ in FIG. 2 includes three sub-pixels sp, and the light-emitting element 10 is a blue LED. The blue sub-pixel spB is the first sub-pixel, an optical component 23 in the blue sub-pixel spB is a scattering unit, and the scattering unit has a light scattering effect, which can ensure the appropriate light exit angle of the blue sub-pixel spB. The scattering unit in the blue sub-pixel spB is provided in the same layer as the color conversion units 22Y in the other sub-pixels. The scattering unit is provided not only to ensure that the blue sub-pixel spB has a large light exit angle, but also to ensure the flatness of the film where the color conversion unit 22Y is located.

Figure 3:
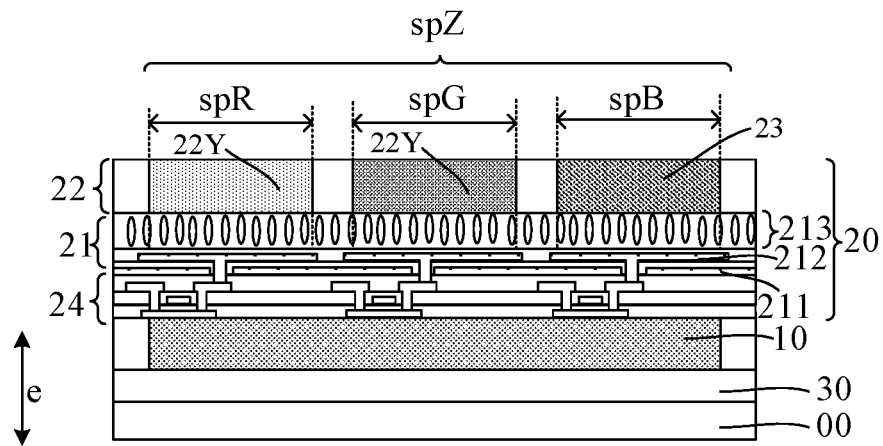
FIG. 3 is another schematic cross-sectional view taken along line A-A' in FIG. 1 according to an embodiment of the present disclosure.

In other embodiments, the light valve in the light valve layer 21 includes liquid crystal molecules. FIG. 3 is another schematic cross-sectional view taken along line A-A' in FIG. 1. As shown in FIG. 3, the light valve layer 21 includes light valves, and each light valve includes a first electrode 211, a second electrode 212, and liquid crystal molecules 213. The first electrodes 211 of the light valves in the sub-pixel group spZ are electrically connected to each other, and the second electrodes 212 of the light valves are isolated from each other. A voltage applied to the first electrode 211 and a voltage applied to the second electrode 212 cooperate to form an electric field that controls the liquid crystal molecules 213 to deflect. The degree of deflection of the liquid crystal molecules 213 determines the light transmittance, thereby enabling the light valve to switch between the first state and the second state. As shown in FIG. 3, the light-limiting structure 20 further includes a light valve driving layer 24, the light valve driving layer 24 includes driver circuits, and each driver circuit includes a transistor and a signal line (not shown in FIG. 3). The second electrode 212 in the light valve is connected to the transistor, and the driver circuit is used for controlling the first state and the second state of the light valve. In this embodiment, the light valve includes the liquid crystal molecules, and the first electrode 211 and the second electrode 212 cooperate to control the deflection degree of the liquid crystal molecules, thereby enabling the light valve to switch between the first state and the second state. The structure of the light valve is simple and easy to realize. Moreover, the switching control of the light valve between the first state and the second state is highly accurate and the switching response is fast.

In the example shown in FIG. 3, the first electrode 211 and the second electrode 212 in the light valve layer 21 are located at a same side of the liquid crystal molecules 213, and the first electrode 211 is below the second electrode 212 in FIG. 3. In other examples, the second electrode 212 is below the first electrode 211. In other examples, the liquid crystal molecules 213 are disposed between the first electrode 211 and the second electrode 212, which is not schematically illustrated herein.

Figure 4:
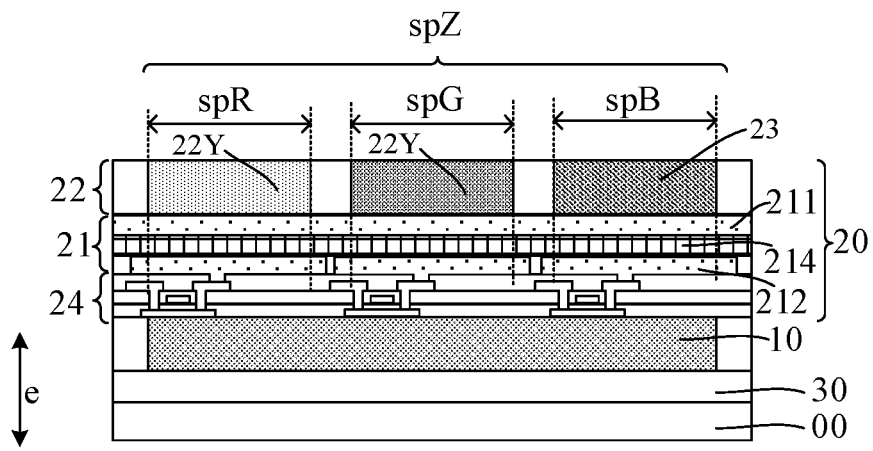
FIG. 4 is another schematic cross-sectional view taken along line A-A' in FIG. 1 according to an embodiment of the present disclosure.

In other embodiments, the light valve in the light valve layer 21 includes an electrochromic material. FIG. 4 is another schematic cross-sectional view taken along line A-A' in the embodiment of FIG. 1. As shown in FIG. 4, the light valve layer 21 includes light valves, and each light valve includes a first electrode 211, a second electrode 212, and an electrochromic material 214. The first electrodes 211 of the light valves in the sub-pixel group spZ are electrically connected to each other, and the second electrodes 212 of the light valves are isolated from each other. A voltage applied to the first electrode 211 and a voltage applied to the second electrode 212 cooperate to change the color of the electrochromic material 214, thereby enabling the light valve to switch between the first state and the second state. The color change of the electrochromic material 214 is reversible, and the electrochromic material 214 includes, for example, tungsten oxide. As shown in FIG. 4, the light-limiting structure 20 further includes a light valve driving layer 24, the light valve driving layer 24 includes driver circuits, and each driver circuit includes a transistor and a signal line (not shown in FIG. 4). The second electrode 212 in the light valve is connected to the transistor, and the driver circuit is used for controlling the first state and the second state of the light valve. In this embodiment, the light valve includes the electrochromic material, and the first electrode 211, the electrochromic material 214, and the second electrode 212 are stacked to form a light valve structure with a thin thickness and a simple structure. Moreover, the switching control of the light valve between the first state and the second state is simple and highly accurate, and the switching response is fast.

Figure 5:
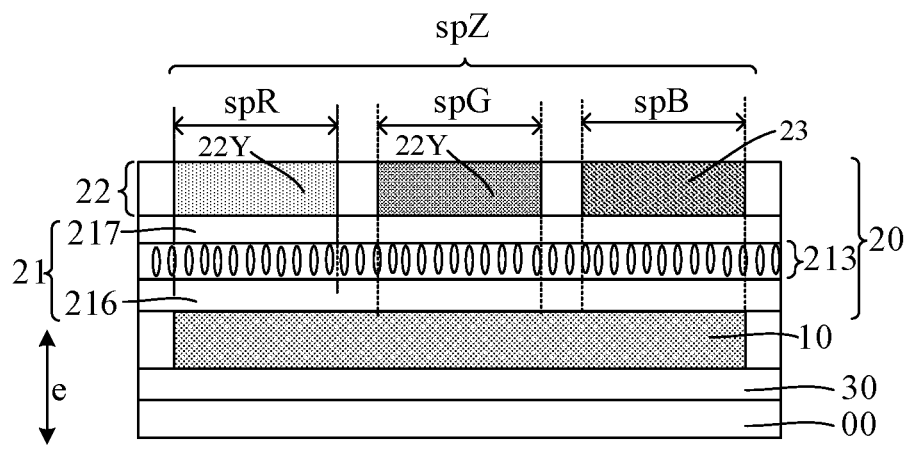
FIG. 5 is another schematic cross-sectional view taken along line A-A' in FIG. 1 according to an embodiment of the present disclosure.

In other embodiments, FIG. 5 is another schematic cross-sectional view taken along line A-A' in the embodiment of FIG. 1. As shown in FIG. 5, the light valve layer 21 includes the liquid crystal molecules 213 and further includes a first substrate 216 and a second substrate 217 disposed opposite to each other, and the liquid crystal molecules 213 are disposed between the first substrate 216 and the second substrate 217. The first substrate 216 is located at a side of the liquid crystal molecules 213 close to the substrate 00. The first electrode 211 in the light valve is disposed on the first substrate 216 or the second substrate 217, and the second electrode 212 in the light valve is disposed on the first substrate 216 or the second substrate 217, and the driver circuit for driving the operation of the light valve is disposed on the same substrate as the second electrode 212. In this embodiment, the first substrate 216, the liquid crystal molecules 213, and the second substrate 217 form a liquid crystal cell, and the color conversion layer 22 is stacked with the liquid crystal cell to form the light-limiting structure 20. When the display panel is fabricated, the liquid crystal cell may be fabricated separately and then attached to other structures in the display panel. For example, the driving layer 30 is fabricated on the substrate 00, the light-emitting element 10 is transferred to the driving layer 30, then the liquid crystal cell is attached with the module to which the light-emitting element 10 is transferred, and then the color conversion layer 22 is fabricated on the liquid crystal cell, such that the color conversion layer 22 is stacked with the liquid crystal cell to form the light-limiting structure 20.

In some embodiments, the first substrate 216 and the second substrate 217 each include a glass substrate.

Figure 6:
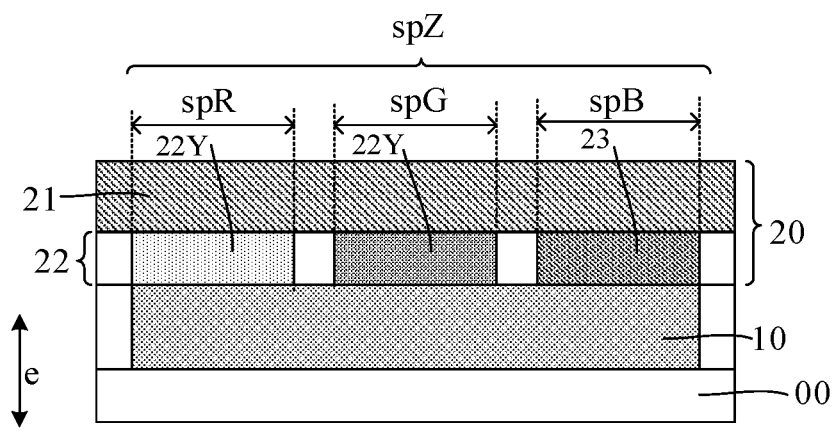
FIG. 6 is another schematic cross-sectional view taken along line A-A' in FIG. 1 according to an embodiment of the present disclosure.

In some embodiments, FIG. 6 is another schematic cross-sectional view taken along line A-A' in FIG. 1. As shown in FIG. 6, the color conversion layer 22 is located at a side of the light valve layer 21 close to the light-emitting element 10, and the light emitted by the light-emitting element 10 passes the color conversion layer 22 and then is directed to the light valve layer 21. In this embodiment, a smaller distance between the color conversion layer 22 and the light-emitting element 10 will cause a larger amount of light emitted by the light-emitting element 10 and received by the color conversion layer 22, and excitation efficiency of the light to the color conversion unit 22Y is higher. The light-emitting efficiency of the light-emitting element 10 can be improved as a result. In addition, in this embodiment, the light emitted by the light-emitting element 10 is directed to the light valve layer 21 after passing the color conversion layer 22. This helps to reduce diagonal light leakage of the display panel, resulting in an improved display effect. Taking the red sub-pixel spR in the sub-pixel group spZ as an example, when the red sub-pixel spR is enabled, the light valve in the red sub-pixel spR is in the first state, and the light valves in the green sub-pixel spG and the blue sub-pixel spB are in the second state. The light emitted by the light-emitting element 10 is directed into the color conversion layer 22, and the color conversion unit 22Y corresponding to the red sub-pixel spR converts the light emitted by the light-emitting element 10 into red light, and the red light is emitted through the position of the red sub-pixel spR, such that the red sub-pixel spR is illuminated. The color conversion unit 22Y corresponding to the red sub-pixel spR may emit red light at a large angle to the green sub-pixel spG or the blue sub-pixel spB. Since the light valves in the green sub-pixel spG and the blue sub-pixel spB are in the second state and are non-light-transmitting, the red light at a large angle will not pass through the green sub-pixel spG or the blue sub-pixel spB, and the diagonal light leakage can be reduced thereby.

Figure 7:
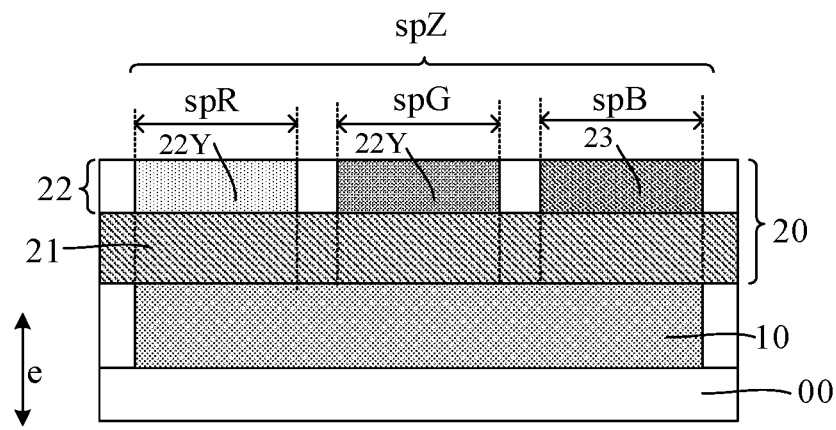
FIG. 7 is another schematic cross-sectional view taken along line A-A' in FIG. 1 according to an embodiment of the present disclosure.

In other embodiments, FIG. 7 is another schematic cross-sectional view taken along line A-A' in FIG. 1. As shown in FIG. 7, the light valve layer 21 is located at a side of the color conversion layer 22 close to the light-emitting element 10. The light emitted by the light-emitting element 10 passes the light valve layer 21 and then is directed to the color conversion layer 22. When a sub-pixel sp in the sub-pixel group spZ is not enabled, a light valve corresponding to the sub-pixel sp is in the second state. In the second state, the light valve is non-light-transmitting, such that no light is directed to the color conversion unit 22Y overlapping with the light valve of the sub-pixel sp. In other words, only when the sub-pixel sp needs to be illuminated/enabled, the included color conversion unit 22Y is excited by injection light; and when the sub-pixel sp does not need to be illuminated/enabled, the included color conversion unit 22Y is not excited. In the embodiments of the present disclosure, when the display panel displays an image, the sub-pixels sp in the sub-pixel group spZ are enabled in sequence. By adopting the design of the embodiments, the number of times that the color conversion unit 22Y is excited can be reduced, and the service life of the color conversion material in the color conversion unit 22Y can be prolonged.

Figure 8:
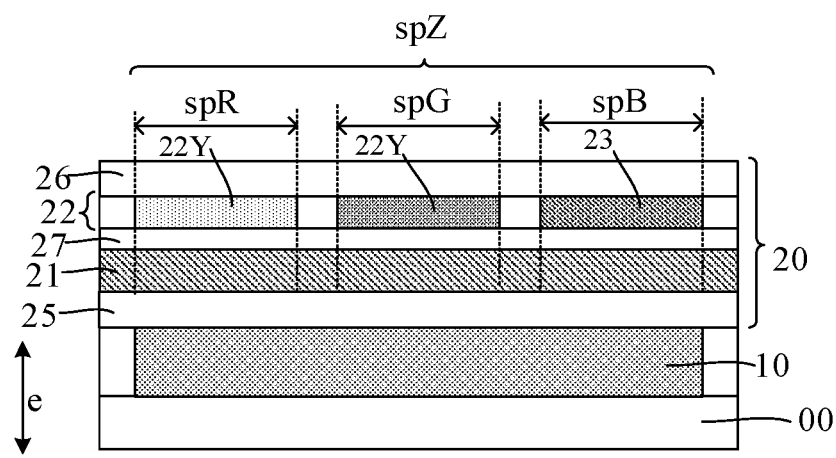
FIG. 8 is another schematic cross-sectional view taken along line A-A' in FIG. 1 according to an embodiment of the present disclosure.

In other embodiments, FIG. 8 is another schematic cross-sectional view taken along line A-A' in FIG. 1. As shown in FIG. 8, the light-limiting structure 20 includes a third substrate 25 and a fourth substrate 26 disposed opposite to each other, and the light valve layer 21 and the color conversion layer 22 are stacked between the third substrate 25 and the fourth substrate 26. In this embodiment, the light valve layer 21 and the color conversion layer 22 are integrated in a cell. For example, the light valve layer 21 includes liquid crystal molecules and the color conversion layer 22 includes quantum dots. The liquid crystal molecules and quantum dots are encapsulated by the third substrate 25 and the fourth substrate 26, to ensure the performance stability of the light-limiting structure 20. When manufacturing the display panel, the light-limiting structure 20 may be manufactured separately and then attached to the light-emitting module to form the display panel. The light-emitting module is the structure formed after the light-emitting element 10 is transferred. In this way, the manufacturing process of the display panel is simpler, and the light-limiting structure 20 manufactured separately does not have adverse effects on the light-emitting element 10 and the pixel circuit.

In some embodiments, as shown in FIG. 8, the third substrate 25 is located at a side of the fourth substrate 26 close to the light-emitting element 10. The light-limiting structure 20 includes a driver circuit for controlling the light valve in the light valve layer 21 to switch between the first state and the second state. The driver circuit is not shown in FIG. 8, and can be understood in combination with the description of the embodiment of FIG. 3 or FIG. 4. The driver circuit includes a transistor. The driver circuit is located on the third substrate 25. The driver circuit is manufactured on the substrate closer to the light valve layer 21, to shorten the distance between the electrodes in the light valve layer 21 and the driver circuit, which is convenient for layout design and control.

In FIG. 8, the light valve layer 21 located at the side of the color conversion layer 22 close to the substrate 00 is shown only for illustration. In other embodiments, the light valve layer 21 is located at the side of the color conversion layer 22 away from the substrate 00, the third substrate 25 is located at a side of the fourth substrate 26 close to the light-emitting element and the driver circuit is located on the third substrate 25.

In other embodiments, the third substrate 25 is located at the side of the fourth substrate 26 close to the light-emitting element 10, and the driver circuit is located on the fourth substrate 26.

In some embodiments, the light valve layer 21 and the color conversion layer 22 are stacked between the third substrate 25 and the fourth substrate 26, and the driver circuit is disposed on a substrate adjacent to the light valve layer 21. This arrangement facilitates the electrical connection between the driver circuit and the second electrodes in the light valve layer 21, and also facilitates the supply of voltage to the first electrodes in the light valve layer 21.

In other embodiments, the driver circuit for controlling the working state of the light valve in the light valve layer 21 is located between the light valve layer 21 and the color conversion layer 22. For example, in the embodiment of FIG. 6 or FIG. 7, the driver circuit is disposed between the light valve layer 21 and the color conversion layer 22.

In some embodiments, as shown in FIG. 8, an optical adhesive layer 27 is provided between the light valve layer 21 and the color conversion unit 22, and the optical adhesive layer 27 plays the role of both adhesion and planarization between the light valve layer 21 and the color conversion unit 22.

Figure 9:
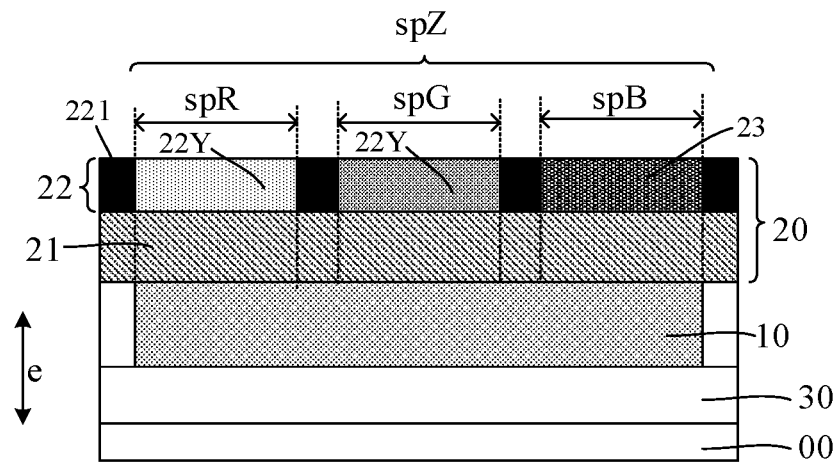
FIG. 9 is another schematic cross-sectional view taken along line A-A' in FIG. 1 according to an embodiment of the present disclosure.

In some embodiments, FIG. 9 is another schematic cross-sectional view taken along line A-A' in FIG. 1. The color conversion layer 22 located at a side of the light valve layer 21 away from the substrate 00 is shown only for illustration. As shown in FIG. 9, a light-blocking wall 221 is provided between adjacent color conversion units 22Y. The blue sub-pixel spB shown in FIG. 9 includes an optical component 23, and a light-blocking wall 221 is also provided between the optical component 23 and the color conversion unit 22Y. The light-blocking wall 221 blocks light transmitting between the color conversion units 22Y, which can prevent the color conversion units 22Y in the sub-pixels sp from laterally leaking light.

In other embodiments, the light-limiting structure 20 includes a light shield layer located at a side of the light valve layer 21 away from the light-emitting element 10. The light shield layer is provided with openings. For example, each sub-pixel sp includes one opening. The light shield layer is similar to the black matrix in a liquid crystal display panel, and can prevent light crosstalk between adjacent sub-pixels sp.

In the drawings of the above example embodiments, the sub-pixel group spZ includes three sub-pixels sp: a red sub-pixel spR, a green sub-pixel spG and a blue sub-pixel spB. The specific solutions of the above embodiments, the relative position between the color conversion layer 22 and the light valve layer 21 in the light-limiting structure 20, the structure of the light valve, and the structure and position of the driver circuit for controlling the light valve, are also applicable to the embodiments in which the sub-pixel group spZ includes two or more sub-pixels sp.

Figure 10:
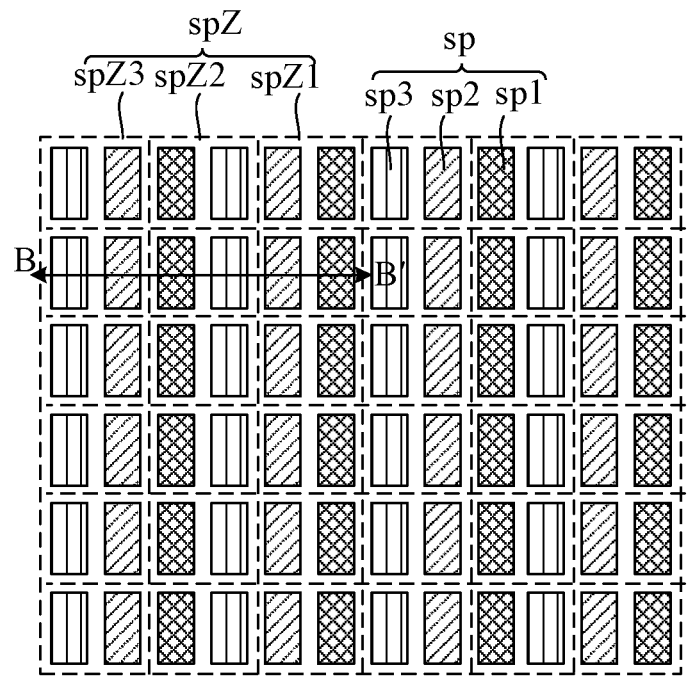
FIG. 10 is a partial schematic view of another display panel according to one or more embodiments of the present disclosure.
Figure 11:
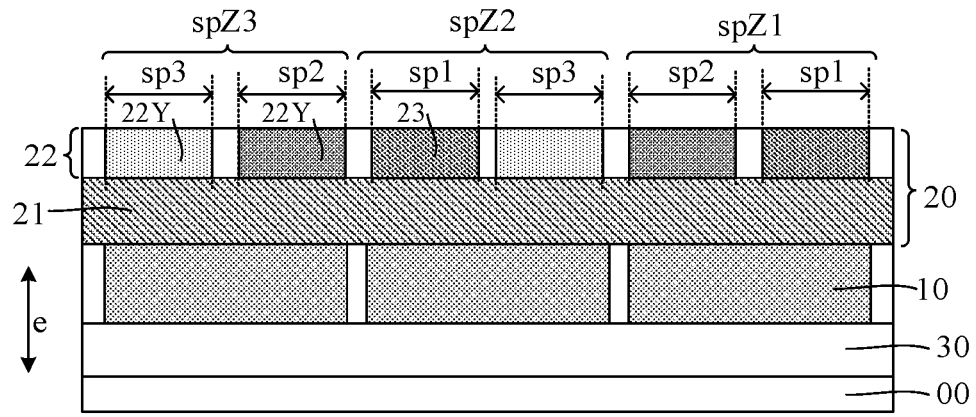
FIG. 11 is a schematic cross-sectional view taken along line B-B' in FIG. 10 according to an embodiment of the present disclosure.

In some embodiments, FIG. 10 is a partial schematic view of another display panel according to an embodiment of the present disclosure, and FIG. 11 is a schematic cross-sectional view taken along line B-B' in FIG. 10. As shown in FIG. 10, sub-pixels sp include a first sub-pixel sp1, a second sub-pixel sp2, and a third sub-pixel sp3 different from each other in color. A sub-pixel group spZ includes sub-pixels SP of two colors. Sub-pixel groups spZ include a first sub-pixel group spZ1, a second sub-pixel group spZ2, and a third sub-pixel group spZ3. In FIG. 11, the regions of the sub-pixel groups spZ are defined by dashed lines that intersect horizontally and vertically. The first sub-pixel group spZ1 includes at least one first sub-pixel sp1 and at least one second sub-pixel sp2, the second sub-pixel group spZ2 includes at least one third sub-pixel sp3 and at least one first sub-pixel sp1, and the third sub-pixel group spZ3 includes at least one second sub-pixel sp2 and at least one third sub-pixel sp3.

In FIG. 11, for example, a light-emitting element 10 is a blue LED, and the color of the first sub-pixel sp1 is the same as the color of light emitted by the light-emitting element 10. In this case, there is no need to dispose the color conversion unit 22Y at the position of the first sub-pixel sp1. The first sub-pixel sp1 includes an optical component 23, and the optical component 23 is in the same layer as the color conversion unit 22Y. Referring to FIG. 11, the light-limiting structure 20 is stacked with the light-emitting element 10. The light-limiting structure 20 includes a color conversion layer 22 and a light valve layer 21. The first sub-pixel sp1 and the second sub-pixel sp2 in the first sub-pixel group spZ1 share one light-emitting element 10, the third sub-pixel sp3 and the first sub-pixel sp1 in the second sub-pixel group spZ2 share one light-emitting element 10, and the second sub-pixel sp2 and the third sub-pixel sp3 in the third sub-pixel group spZ3 share one light-emitting element 10.

The display panel provided in this embodiment includes three types of sub-pixel groups spZ, each type of sub-pixel group spZ includes sub-pixels sp of two colors, and the sub-pixel groups spZ include the same quantity of sub-pixels sp. The three types of sub-pixel groups spZ include the light-emitting elements 10 with the same specification (such as the size), such that the light-emitting elements 10 on the whole display panel have the same size, thereby simplifying the manufacturing process of the light-emitting elements 10. Moreover, all the sub-pixels sp in each sub-pixel group spZ share one light-emitting element 10. This allows for an increase in the size of the light-emitting element 10 and a reduction in the quantity of light-emitting elements 10 in the display panel. As a result, it decreases the difficulty of alignment and picking up during the transfer process and reduces the number of transfers, ultimately improving the yield of the transfer process In some embodiments, the light-emitting element 10 shown in FIG. 11 is a blue LED, the first sub-pixel sp1 is a blue sub-pixel, and the second sub-pixel sp2 and the third sub-pixel sp3 are either the red sub-pixel or the green sub-pixel. For example, the color conversion unit 22Y of the second sub-pixel sp2 converts the blue light emitted by the blue LED into green light, and the color conversion unit 22Y of the third sub-pixel sp3 converts the blue light emitted by the blue LED into red light. The first sub-pixel group spZ1 includes one color conversion unit 22Y, and the second sub-pixel group spZ2 and the third sub-pixel group spZ3 each include two color conversion units 22Y. When displaying an image, the light exit position of the light emitted by the light-emitting element 10 is limited by the light-limiting structure 20 in the sub-pixel spZ. The first sub-pixel sp1 and the second sub-pixel sp2 in the first sub-pixel group spZ1 are enabled in sequence, the third sub-pixel sp3 and the first sub-pixel sp1 in the second sub-pixel group spZ2 are enabled in sequence, and the second sub-pixel sp2 and the third sub-pixel sp3 in the third sub-pixel group spZ3 are enabled in sequence. When displaying an image, the light-emitting element 10 in each sub-pixel group spZ emits light twice, and the sub-pixels sp in the sub-pixel group spZ sequentially display corresponding grayscales, such that lights from the sub-pixels sp of different colors in the display panel are mixed over time to display the color image.

In other embodiments, the plurality of sub-pixels sp of three colors in the display panel are divided into three types of sub-pixel groups spZ, each type of sub-pixel group spZ includes sub-pixels sp of two colors, and the sub-pixel groups spZ include the same quantity of sub-pixels sp. The light-emitting element 10 shared by the sub-pixels sp in the sub-pixel group spZ is a UV LED. In this embodiment, each sub-pixel sp is provided with a color conversion unit 22Y, and the quantity of color conversion units 22Y in the sub-pixel group spZ is the same as the quantity of sub-pixels sp. For example, the color conversion unit 22Y in the red sub-pixel sp converts the UV light emitted by the UV LED into red light, the color conversion unit 22Y in the green sub-pixel sp converts the UV light emitted by the UV LED into green light, and the color conversion unit 22Y in the blue sub-pixel sp converts the UV light emitted by the ultraviolet LED into blue light.

In the embodiment of FIG. 10, a plurality of sub-pixels sp in the display panel are divided into three types of sub-pixel groups spZ, and the sub-pixel group spZ includes two sub-pixels sp of different colors. In other embodiments, the sub-pixel group spZ includes four sub-pixels sp of two colors.

Figure 12:
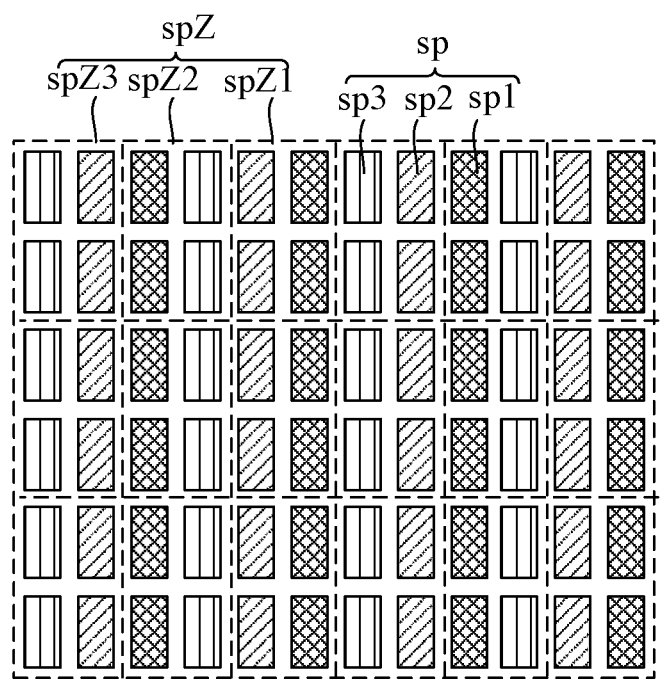
FIG. 12 is a partial schematic view of another display panel according to one or more embodiments of the present disclosure.

FIG. 12 is a partial schematic view of another display panel according to an embodiment of the present disclosure. As shown in FIG. 12, the regions of the sub-pixel groups spZ are defined by dashed lines that intersect horizontally and vertically. The sub-pixel groups spZ include a first sub-pixel group spZ1, a second sub-pixel group spZ2, and a third sub-pixel group spZ3. Each sub-pixel group spZ includes four sub-pixels sp of two colors. All the sub-pixels sp in the same sub-pixel group spZ share one light-emitting element. In a display mode, when displaying an image, four sub-pixels sp in the sub-pixel group spZ are enabled in sequence, that is, the light-emitting element corresponding to the sub-pixel group spZ emits light for four times, and the four sub-pixels sp sequentially display corresponding grayscales, such that lights from the sub-pixels sp of different colors in the display panel are mixed over time to display the color image.

In some embodiments, the sub-pixels sp include a first sub-pixel sp1, a second sub-pixel sp2, and a third sub-pixel sp3 that are different in colors. The sub-pixel group spZ includes at least one first sub-pixel sp1, at least one second sub-pixel sp2, and at least one third sub-pixel sp3. As shown in FIG. 1, the red sub-pixel spR, the green sub-pixel spG, and the blue sub-pixel spB are the first sub-pixel sp1, the second sub-pixel sp2, and the third sub-pixel sp3, and the sub-pixel group spZ includes one first sub-pixel sp1, one second sub-pixel sp2, and one third sub-pixel sp3. In this embodiment, the sub-pixel group spZ includes at least three sub-pixels sp. In this case, the at least three sub-pixels sp in the display panel share one light-emitting element, such that the size of the light-emitting element is large, and the manufacturing process thereof is relatively simple. In addition, increasing the size of the light-emitting element 10 can reduce the requirements on machine precision in the transfer process. This, in turn, helps to decrease the difficulty of alignment and picking up during the transfer process, ultimately improving the yield of the transfer process.

Figure 13:
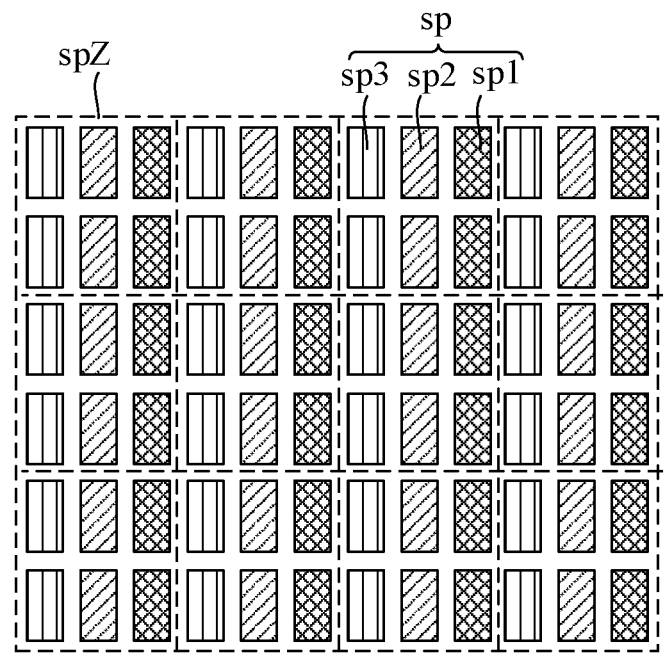
FIG. 13 is a partial schematic view of another display panel according to one or more embodiments of the present disclosure.

In another embodiment, FIG. 13 is a partial schematic view of another display panel according to an embodiment of the present disclosure. As shown in FIG. 13, the regions of the sub-pixel groups spZ are defined by dashed lines that intersect horizontally and vertically. As shown in FIG. 13, the sub-pixel group spZ includes six sub-pixels sp: two first sub-pixels sp1, two second sub-pixels sp2, and two third sub-pixels sp3. The six sub-pixels sp in the sub-pixel group spZ share one light-emitting element.

Figure 14:
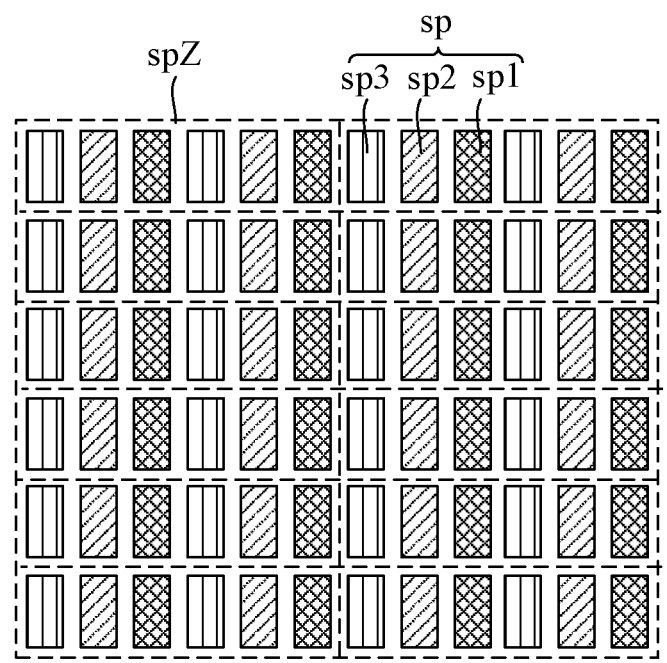
FIG. 14 is a partial schematic view of another display panel according to one or more embodiments of the present disclosure.

In another embodiment, FIG. 14 is a partial schematic view of another display panel according to an embodiment of the present disclosure. As shown in FIG. 14, the regions of the sub-pixel groups spZ are defined by dashed lines that intersect horizontally and vertically. As shown in FIG. 14, the sub-pixel group spZ includes six sub-pixels sp: two first sub-pixels sp1, two second sub-pixels sp2, and two third sub-pixels sp3.

In a display mode, when an image is being displayed, six sub-pixels sp in the sub-pixel group spZ are enabled in sequence, that is, the light-emitting element corresponding to the sub-pixel group spZ is activated and emits light for six times, and the six sub-pixels sp sequentially display corresponding grayscales, such that lights from the sub-pixels sp of different colors in the display panel are mixed over time to display the color image.

The light-emitting element shared by the sub-pixels sp in the sub-pixel group spZ in the embodiments of FIG. 13 and FIG. 14 may be a blue LED or a UV LED.

In some embodiments, the sub-pixels sp in the sub-pixel group spZ are arranged in n rows and m columns, n and m are positive integers, and n and m are not equal to 1 at the same time. As shown in FIG. 1, the three sub-pixels sp in each sub-pixel group spZ are arranged in one row and three columns. As shown in FIG. 11, the two sub-pixels sp in each sub-pixel group spZ are arranged in one row and two columns. As shown in FIG. 12, the four sub-pixels sp in each sub-pixel group spZ are arranged in two rows and two columns. As shown in FIG. 13, the six sub-pixels sp in the sub-pixel group spZ are arranged in two rows and three columns. As shown in FIG. 14, the six sub-pixels sp in sub-pixel group spZ are arranged in one row and six columns. In the embodiments of the present disclosure, the sub-pixels sp in the sub-pixel group spZ are arranged in an array. In other words, the sub-pixels sp in the sub-pixel group spZ are consecutive and adjacent to each other. This arrangement makes it easier to group a plurality of sub-pixels sp in the display panel, also ensures a more regular arrangement of the light-emitting elements 10 in the whole display panel. In addition, it simplifies the transfer process of the light-emitting elements 10 and improves the transfer yield.

Figure 15:
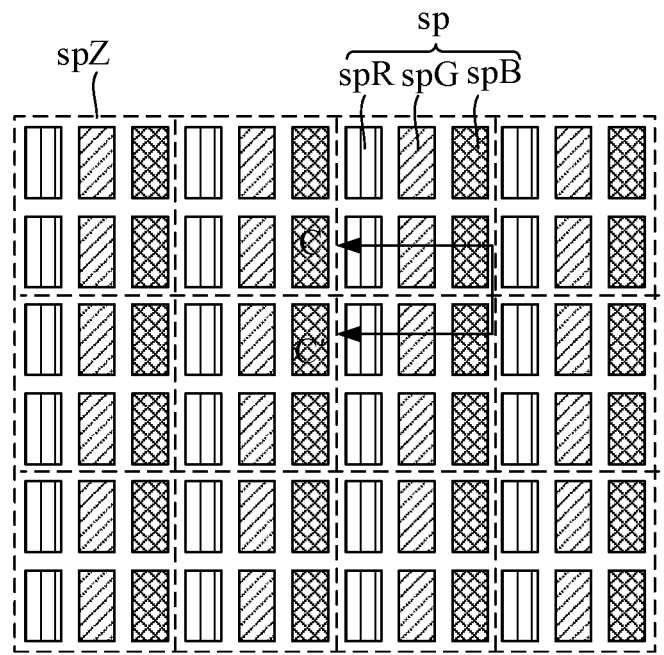
FIG. 15 is a partial schematic view of another display panel according to one or more embodiments of the present disclosure.
Figure 16:
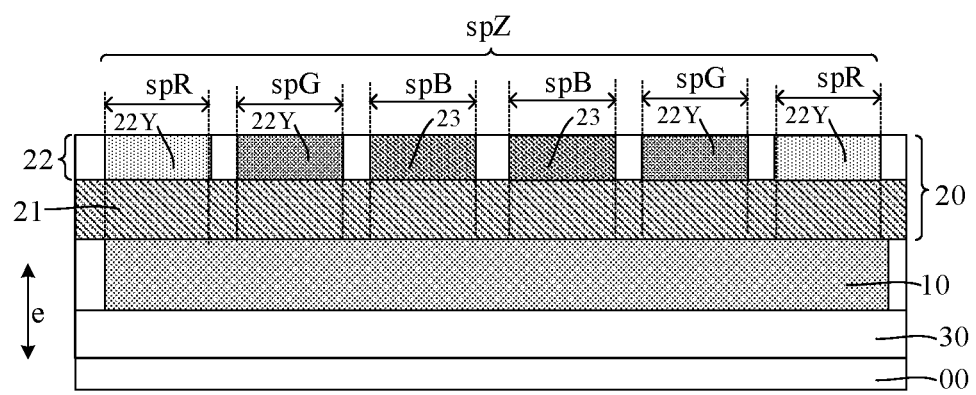
FIG. 16 is a schematic cross-sectional view taken along line C-C' in FIG. 15 according to an embodiment of the present disclosure.

Embodiments of the present disclosure further provide another display panel. FIG. 15 is a partial schematic view of another display panel according to an embodiment of the present disclosure, and FIG. 16 is a schematic cross-sectional view taken along line C-C' in FIG. 15. With reference to FIG. 15 and FIG. 16, the display panel includes a substrate 00 and sub-pixel groups spZ located at a side of the substrate 00. The sub-pixel group spZ includes sub-pixels sp of at least two colors, and the sub-pixels sp in each sub-pixel group spZ share one light-emitting element 10. In FIG. 15, for example, the sub-pixel group spZ includes two red sub-pixels spR, two green sub-pixels spG, and two blue sub-pixels spB. The sub-pixel group spZ includes a light-limiting structure 20. Along a direction e perpendicular to a plane of the substrate 00, the light-limiting structure 20 overlaps with the light-emitting element 10 and is located at a light exit side of the light-emitting element 10. The light-limiting structure 20 is used to limit a light exit position of the light-emitting element 10. The display panel further includes a driving layer the driving layer 30 is provided with a plurality of pixel circuits, and the pixel circuit is used to drive the corresponding light-emitting element 10 to emit light. When the display panel displays an image, the sub-pixels sp of different colors in the sub-pixel group spZ are enabled in sequence, and the sub-pixels sp of the same color are enabled simultaneously. When the sub-pixels sp of the same color are enabled, the light-limiting structure 20 causes the light emitted by the light-emitting element 10 to exit only from the enabled sub-pixels sp.

When the display panel displays an image, the sub-pixels sp of different colors in each sub-pixel group spZ are enabled in sequence, and the sub-pixels sp of the same color are enabled simultaneously. All the sub-pixel groups spZ in the display panel are enabled over time, such that lights from the sub-pixels sp of different colors in the display panel are mixed over time to display a complete color image. In this embodiment, all the sub-pixels sp in each sub-pixel group spZ share one light-emitting element 10. This allows for an increase in the size of the light-emitting element 10 and a reduction in the quantity of light-emitting elements 10 required in the production of a display panel with a fixed sub-pixel size and density. Increasing the size of the light-emitting element 10 can reduce the requirements on machine precision in the transfer process. This, in turn, helps to decrease the difficulty of alignment and picking up during the transfer process, ultimately improving the yield of the transfer process. Reducing the quantity of light-emitting elements 10 can reduce the number of transfers, which can also improve the transfer yield.

In some embodiments, as shown in FIG. 16, the light-limiting structure 20 includes a light valve layer 21, and the light valve layer 21 includes light valves (not marked in FIG. 16). In the sub-pixel group spZ, each sub-pixel sp includes one light valve. The light valve has a first state and a second state, and the light valve is light transmitting in the first state and non-light-transmitting in the second state. In the sub-pixel group spZ, the light valve of the sub-pixel sp is in the first state when the sub-pixel sp is enabled, and the light valve of the sub-pixel sp is in the second state when the sub-pixel sp is not enabled. The structure of the light valve can be understood with reference to the embodiment of FIG. 3 or FIG. 4 above, and details are not repeated herein.

In some embodiments, as shown in FIG. 16, the light-limiting structure 20 further includes a color conversion layer 22. The light valve layer 21 and the color conversion layer 22 are stacked along a direction e perpendicular to a plane of the substrate 00. The color conversion layer 22 in each sub-pixel group spZ includes M color conversion units 22Y, the light valve layer 21 in each sub-pixel group spZ includes N light valves, M and N are positive integers, N≥2, and 1≤M≤N. A sub-pixel sp whose color is different from the color of the light emitted by the light-emitting element 10 includes the color conversion unit 22Y. A sub-pixel sp whose color is the same as the color of the light emitted by the light-emitting element 10 does not need the color conversion unit 22Y.

The light-limiting structure 20 includes the stacked light valve layer 21 and color conversion layer 22, the light valve in the light valve layer 21 can control whether the light emitted by the light-emitting element 10 passes through the sub-pixel sp at which the light valve is located, and the color conversion unit 22Y in the color conversion layer 22 can convert the color of the light. The light-limiting structure 20 including the color conversion layer 22 and the light valve layer 21 can cooperate with the light-emitting element 10 to achieve independent illumination of sub-pixels sp of different colors in the sub-pixel group spZ. When an image is displayed, the sub-pixels sp of different colors in the sub-pixel group spZ are enabled in sequence, and the sub-pixels sp of the same color are enabled simultaneously. All the sub-pixel groups spZ are illuminated over time, such that lights from the sub-pixels sp of different colors in the display panel are mixed over time to display the color image.

In the embodiments of the present disclosure, the light-emitting element 10 is connected to the pixel circuit, and the sub-pixels sp in each sub-pixel group spZ share one pixel circuit. The luminance of the light-emitting element 10 is controlled by the pixel circuit, which cooperate with the light-limiting structure 20 to cause the sub-pixels sp in the sub-pixel group spZ to display an image. The pixel circuit in the display panel provided in the embodiments of the present disclosure may be of the aTbC structure, a and b are positive integers, T represents a transistor, and C represents a capacitor.

Figure 17:
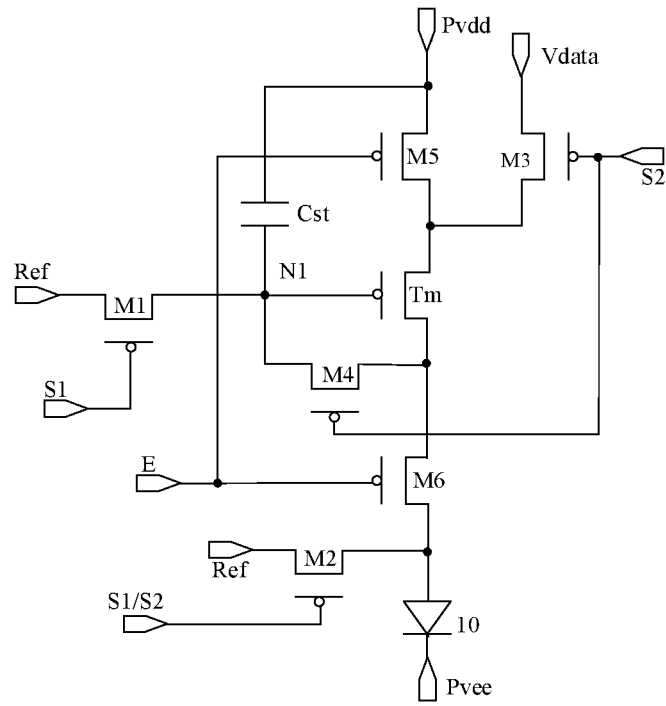
FIG. 17 is a schematic diagram of a pixel circuit according to one or more embodiments of the present disclosure.

For example, the pixel circuit is of a 7T1C structure. FIG. 17 is a schematic diagram of a pixel circuit according to an embodiment of the present disclosure, and FIG. 18 is a timing diagram of the pixel circuit according to the embodiment of FIG. 17.

As show in FIG. 17, the pixel circuit includes a driver transistor Tm, a gate reset transistor M1, an electrode reset transistor M2, a data writing transistor M3, a threshold compensation transistor M4, a first light-emitting control transistor M5, a second light-emitting control transistor M6, and a storage capacitor Cst. The gate reset transistor M1 includes a first electrode receiving a reset signal Ref, a second electrode coupled to a gate of the driver transistor Tm, and a gate receiving a first scanning signal S1. The data writing transistor M3 includes a first electrode receiving a data signal Vdata, and a second electrode coupled to a first electrode of the driver transistor Tm. The threshold compensation transistor M4 is connected in series between the gate and the second electrode of the driver transistor Tm, and both the gate of the data writing transistor M3 and the gate of the threshold compensation transistor M4 receive a second scanning signal S2. The driver transistor Tm is connected in series between the first light-emitting control transistor M5 and the second light-emitting control transistor M6, and both the gate of the first light-emitting control transistor M5 and the gate of the second light-emitting control transistor M6 receive a light emission control signal E. In addition, a first electrode of the storage capacitor Cst and a first electrode of the first light-emitting control transistor M5 receive an anode power signal Pvdd, a second electrode of the second light-emitting control transistor M6 is coupled to a first electrode of the light-emitting element 10, and a second electrode of the light-emitting element 10 receives a cathode power signal Pvee. The electrode reset transistor M2 includes a first electrode receiving a reset signal Ref, a second electrode coupled to the first electrode of the light-emitting element 10, and a gate receiving the first scanning signal S1 or the second scanning signal S2.

In the example shown in FIG. 17, all transistors in the pixel circuit are P-type transistors. In other embodiments, the gate reset transistor M1 and the threshold compensation transistor M4 are N-type transistors, and the remaining transistors are P-type transistors.

Figure 18:
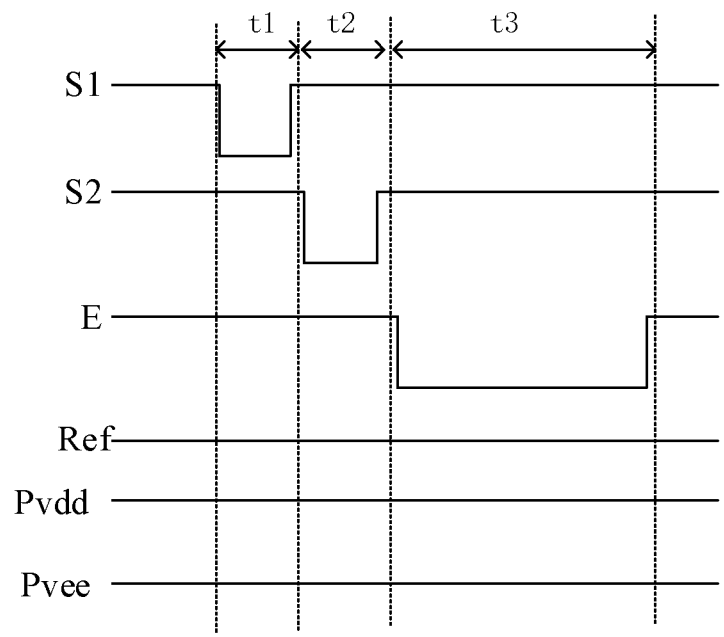
FIG. 18 is a timing diagram of a pixel circuit in FIG. 17 according to an embodiment of the present disclosure.

The working principle of the pixel circuit in FIG. 17 is understood with reference to the timing diagram shown in FIG. 18. A working cycle of the pixel circuit includes a reset phase t1, a data writing phase t2, and a light-emitting phase t3. A first node N1 is reset in the reset phase t1, and a data voltage is written to the first node N1 in the data writing phase t2. In the light-emitting phase t3, the driver transistor Tm generates a driving current under the potential control of the first node N1 and provides it to the light-emitting element 10.

The display panel is provided with at least a data line for transmitting the data signal Vdata, a first scanning line for transmitting the first scanning signal S1, a second scanning line for transmitting the second scanning signal S2, a light-emitting control line for transmitting the light emission control signal E, a reset signal line for transmitting the reset signal Ref, and a power supply line for transmitting the anode power signal Pvdd.

Figure 19:
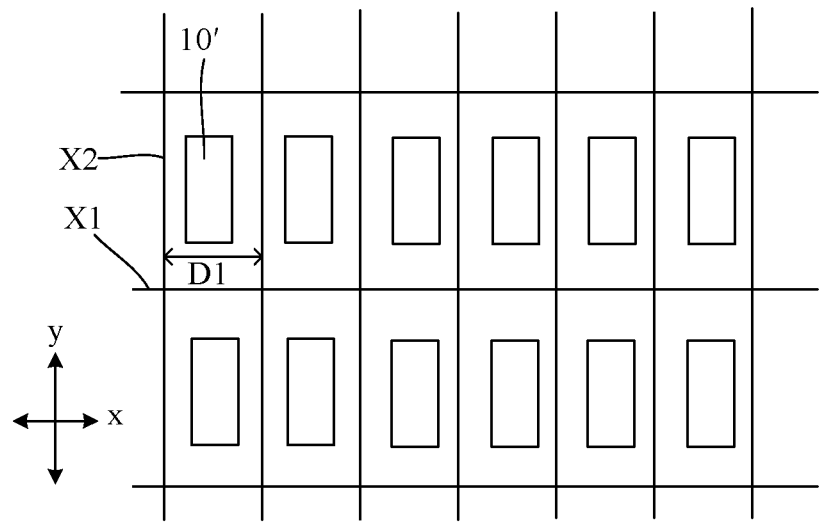
FIG. 19 is a partial schematic view of a legacy display panel.

FIG. 19 is a partial schematic view of a conventional display panel. As shown in FIG. 19, the display panel includes a plurality of light-emitting elements 10', a first signal line X1 extending in a first direction x, and a second signal line X2 extending in a second direction y. The first signal line X1 intersects the second signal line X2. The light-emitting element 10' is connected to a pixel circuit (not shown in FIG. 19), and the first signal line X1 and the second signal line X2 cooperate to drive the pixel circuit. The display panel includes red sub-pixels, green sub-pixels and blue sub-pixels. Conventionally, each sub-pixel includes one light-emitting element 10'. As shown in FIG. 19, the width of the region occupied by each sub-pixel in the first direction x is D1.

Figure 20:
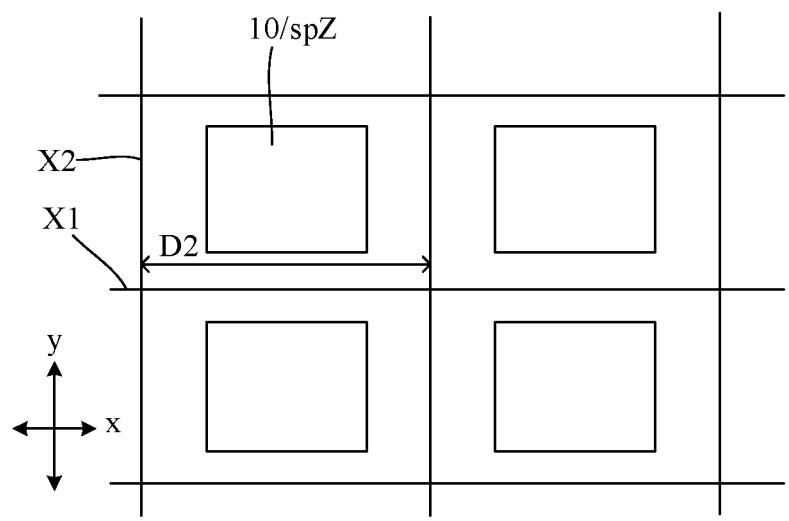
FIG. 20 is a partial schematic view of a display panel according to one or more embodiments of the present disclosure.

FIG. 20 is a partial schematic view of a display panel according to an embodiment of the present disclosure. FIG. 20 shows for illustration that each sub-pixel group spZ includes three sub-pixels. Light-emitting elements 10, first signal lines X1 extending along a first direction x, and second signal lines X2 extending along a second direction y are illustrated in FIG. 20. In this embodiment of the present disclosure, each light-emitting element 10 corresponds to three sub-pixels, and each light-emitting element 10 is connected to one pixel circuit. The first signal line X1 cooperates with the second signal line X2 to drive the pixel circuit. The width of the region occupied by each sub-pixel group spZ in the first direction x is D2. The first signal lines X1 include a first scanning line, a second scanning line, a reset signal line, and a light-emitting control line for driving the pixel circuit, and the second signal lines X2 include a data line and a power line.

When the size of the sub-pixel in the embodiment of FIG. 20 is the same as that in the display panel in FIG. 19, each sub-pixel group spZ in FIG. 20 occupies the space of three sub-pixels in FIG. 19, and D2 is approximately three times of D1. The size of the light-emitting element 10 in this embodiment of the present disclosure is larger than that of the light-emitting element 10' in the display panel in FIG. 19, and the quantity of the second signal lines X2 in the display panel is reduced. Taking the second signal lines X2 including a data line as an example, the quantity of data lines in the embodiment of FIG. 20 is one third of that in the display panel of FIG. 19. Compared with the conventional design, the size of the light-emitting element 10 in the embodiments of the present disclosure is larger, the quantity of signal lines is decreased, and the layout is simpler.

In some embodiments, the display panel further includes a redundancy sub-pixel group, and the redundancy sub-pixel group includes a redundancy light-emitting element and a redundancy light-limiting structure. In an embodiment, the redundancy sub-pixel group and the sub-pixel group spZ are in one-to-one correspondence, and the redundancy light-emitting element may share the pixel circuit with the light-emitting element in the corresponding sub-pixel group spZ. When the light-emitting element 10 in the sub-pixel group spZ fails, the redundancy light-emitting element is electrically connected to the corresponding pixel circuit through the repair process, and the redundancy sub-pixel group is enabled to display, so as to avoid any loss of display image information and ensure the image integrity of the display panel.

In other embodiments, the sub-pixel group spZ further includes a redundancy light-emitting element. That is, the sub-pixel group spZ includes two light-emitting elements, both of which overlap with the light-limiting structure in the sub-pixel group spZ. Normally, one light-emitting element (primary light-emitting element) emits light and the other is redundancy. When the primary light-emitting element fails, the connection between the failed light-emitting element and the pixel circuit is disconnected through the repair process, and the redundancy light-emitting element is electrically connected to the corresponding pixel circuit, thereby enabling the redundancy light-emitting element to ensure that the sub-pixel sp displays normally.

Figure 21:
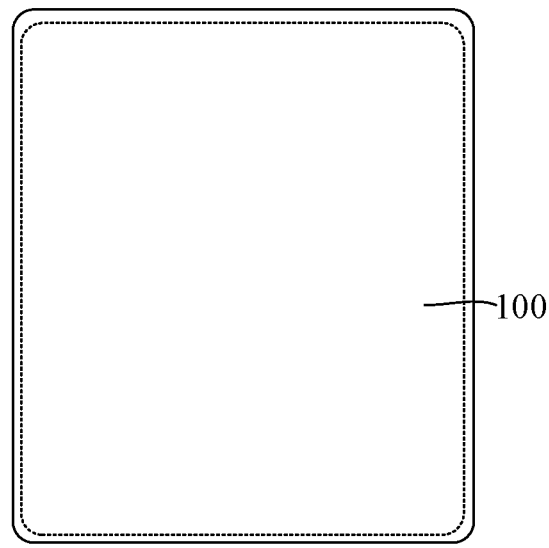
FIG. 21 is a schematic diagram of a display apparatus according to one or more embodiments of the present disclosure.

Based on the same inventive concept, an embodiment of the present disclosure further provides a display apparatus. FIG. 21 is a schematic diagram of a display apparatus according to an embodiment of the present disclosure. As shown in FIG. 21, the display apparatus includes the display panel 100 according to any embodiment of the present disclosure. The structure of the display panel 100 has been described in the foregoing embodiments, and details are not described herein again. The display apparatus provided in this embodiment of the present disclosure may be, for example, an electronic device such as a mobile phone, a computer, a tablet, an automotive display, and a smart wearable product.

The above descriptions are merely preferred examples of the present disclosure, and are not intended to limit the present disclosure. Any modifications, equivalent replacements, improvements, and the like made within the spirit and principle of the present disclosure shall fall within the protection scope of the present disclosure.

Finally, it should be noted that the foregoing embodiments are merely intended to describe and not to limit the technical solutions of the present disclosure. Although the present disclosure has been described in detail with reference to the foregoing embodiments, persons skilled in the art should understand that they can still make modifications to the technical solutions described in the foregoing embodiments or make equivalent replacements to some or all of the technical features thereof. These modifications or replacements do not make the essence of the corresponding technical solutions deviate from the scope of the technical solutions of the embodiments of the present disclosure.

What is claimed is:

1. A display panel, comprising:
    a substrate; and
    a sub-pixel group located at a side of the substrate,
    wherein the sub-pixel group comprises sub-pixels of at least two different colors and a light-limiting structure,
    wherein the sub-pixels in the sub-pixel group share one light-emitting element,
    wherein the light-limiting structure is located at a light exit side of the light-emitting element, overlaps with the light-emitting element along a direction perpendicular to a plane of the substrate, and limits a light exit position of the light-emitting element,
    wherein, when the display panel displays an image, the sub-pixels in the sub-pixel group are enabled in sequence, and
    wherein, when one of the sub-pixels is enabled, the light-limiting structure causes light emitted by the light-emitting element to exit only from the enabled sub-pixel.

2. The display panel according to claim 1, wherein the light-limiting structure comprises a light valve layer, and the light valve layer comprises light valves,
    wherein, in the sub-pixel group, each sub-pixel comprises one light valve, and the light valve has a first state in which the light valve is light transmitting and a second state in which the light valve is non-light-transmitting, and
    wherein, for each sub-pixel in the sub-pixel group, the light valve of the sub-pixel is in the first state when the sub-pixel is enabled, and is in the second state when the sub-pixel is not enabled.

3. The display panel according to claim 2, wherein the first state comprises at least a first sub-state and a second sub-state, and
    wherein a light transmittance of the light valve in the first sub-state is greater than a light transmission of the light valve in the second sub-state.

4. The display panel according to claim 2, wherein the light valve comprises liquid crystal molecules or an electrochromic material.

5. The display panel according to claim 4, wherein the light valve layer comprises first electrodes and second electrodes, the first electrodes of the light valves in the sub-pixel group are electrically connected to each other, and the second electrodes of the light valves are isolated from each other, and
    the first electrode and the second electrode cooperate with each other to control the liquid crystal molecules to deflect, or the first electrode and the second electrode cooperate with each other to control a color of the electrochromic material to change.

6. The display panel according to claim 2, wherein the light valve comprises liquid crystal molecules, and
    wherein the light valve layer further comprises a first substrate and a second substrate disposed opposite to each other, and the liquid crystal molecules are located between the first substrate and the second substrate.

7. The display panel according to claim 2, wherein the light-limiting structure further comprises a color conversion layer stacked with the light valve layer along the direction perpendicular to the plane of the substrate, and wherein the color conversion layer in the sub-pixel group comprises M color conversion units, the light valve layer in the sub-pixel group comprises N light valves, M and N are positive integers, N≥2, 1≤M≤N, and a sub-pixel of the sub-pixels whose color is different from a color of light emitted by the light-emitting element comprises one of the color conversion units.

8. The display panel according to claim 7, wherein the color conversion layer is located at a side of the light valve layer adjacent to the light-emitting element, or the light valve layer is located at a side of the color conversion layer adjacent to the light-emitting element.

9. The display panel according to claim 7, wherein the light-limiting structure comprises a third substrate and a fourth substrate disposed opposite to each other, and the light valve layer and the color conversion layer are stacked between the third substrate and the fourth substrate.

10. The display panel according to claim 9, wherein the light-limiting structure further comprises a driver circuit for controlling the light valve to switch between the first state and the second state, and wherein the third substrate is located at a side of the fourth substrate adjacent to the light-emitting element, and the driver circuit is located on the third substrate.

11. The display panel according to claim 7, wherein a light-blocking wall is provided between adjacent ones of the color conversion units.

12. The display panel according to claim 7, wherein the sub-pixels in the sub-pixel group comprise a first sub-pixel, and the color of the first sub-pixel is the same as the color of the light emitted by the light-emitting element, and wherein the first sub-pixel comprises a scattering unit, and the scattering unit is located in a same layer as the color conversion unit.

13. The display panel according to claim 1, wherein a number of the sub-pixel group is at least three, and the at least three sub-pixel groups comprise a first sub-pixel group, a second sub-pixel group, and a third sub-pixel group, wherein the sub-pixels of the first sub-pixel group comprise at least one first sub-pixel and at least one second sub-pixel, wherein the sub-pixels of the second sub-pixel group comprise at least one third sub-pixel and at least one first sub-pixel, wherein the sub-pixels of the third sub-pixel group comprise at least one second sub-pixel and at least one third sub-pixel, and wherein the color of the first sub-pixel, the color of the second sub-pixel, and the color of the third sub-pixel are different from each other.

14. The display panel according to claim 1, wherein the sub-pixels of the sub-pixel group comprise at least one first sub-pixel, at least one second sub-pixel, and at least one third sub-pixel, and the color of the first sub-pixel, the color of the second sub-pixel, and the color of the third sub-pixel are different from each other.

15. The display panel according to claim 1, wherein the sub-pixels in the sub-pixel group are arranged in n rows and m columns, n and m are positive integers, and n and m are not equal to 1 at the same time.

16. The display panel according to claim 1, further comprising pixel circuits connected to the light-emitting elements of the sub-pixel groups, wherein the sub-pixels in one sub-pixel group share one of the pixel circuits.

17. A display panel, comprising:

a substrate; and a sub-pixel group located at a side of the substrate, wherein the sub-pixel group comprises sub-pixels of at least two different colors and a light-limiting structure, wherein the sub-pixels in the sub-pixel group share one light-emitting element, wherein the light-limiting structure is located at a light exit side of the light-emitting element, overlaps with the light-emitting element along a direction perpendicular to a plane of the substrate, and limits a light exit position of the light-emitting element, wherein, when the display panel displays an image, for the sub-pixels in the sub-pixel group, sub-pixels of different colors are enabled in sequence, and sub-pixels of a same color are enabled simultaneously, and wherein, when the sub-pixels of the same color are enabled, the light-limiting structure causes light emitted by the light-emitting element to exit only from the enabled sub-pixels.

18. The display panel according to claim 17, wherein the light-limiting structure comprises a light valve layer, and the light valve layer comprises light valves, wherein, in the sub-pixel group, each sub-pixel comprises one light valve that has a first state in which the light valve is light transmitting and a second state in which the light valve is non-light-transmitting, and wherein, for each sub-pixel in the sub-pixel group, the light valve of the sub-pixel is in the first state when the sub-pixel is enabled, and is in the second state when the sub-pixel is not enabled.

19. The display panel according to claim 18, wherein the light-limiting structure further comprises a color conversion layer stacked with the light valve layer along the direction perpendicular to the plane of the substrate, and wherein the color conversion layer in the sub-pixel group comprises M color conversion units, the light valve layer in the sub-pixel group comprises N light valves, M and N are positive integers, N≥2, 1≤M≤N, and a sub-pixel of the sub-pixels whose color is different from a color of light emitted by the light-emitting element comprises one of the color conversion units.

20. A display apparatus comprising:

a display panel comprising:

a substrate; and a sub-pixel group located at a side of the substrate, wherein the sub-pixel group comprises sub-pixels of at least two different colors and a light-limiting structure, wherein the sub-pixels in the sub-pixel group share one light-emitting element, wherein the light-limiting structure is located at a light exit side of the light-emitting element, overlaps with the light-emitting element along a direction perpendicular to a plane of the substrate, and limits a light exit position of the light-emitting element, wherein, when the display panel displays an image, the sub-pixels in the sub-pixel group are enabled in sequence, and wherein, when one of the sub-pixels is enabled, the light-limiting structure causes light emitted by the light-emitting element to exit only from the enabled sub-pixel.

* * * * *